US012360151B2

(12) United States Patent
Dernaika et al.

(10) Patent No.: US 12,360,151 B2
(45) Date of Patent: Jul. 15, 2025

(54) METHOD OF TESTING, WAFER, AND TESTING STATION

(71) Applicant: ROCKLEY PHOTONICS LIMITED, Altrincham (GB)

(72) Inventors: Mohamad Dernaika, Cork (IE); Ludovic Caro, Cork (IE); Alison Perrott, Cork (IE); Hua Yang, Cork (IE); Frank Peters, Cork (IE)

(73) Assignee: Rockley Photonics Limited, Altrincham (GB)

( * ) Notice: Subject to any disclaimer, the term of this patent is extended or adjusted under 35 U.S.C. 154(b) by 225 days.

(21) Appl. No.: 18/245,997

(22) PCT Filed: Sep. 23, 2021

(86) PCT No.: PCT/EP2021/076196
§ 371 (c)(1),
(2) Date: Mar. 20, 2023

(87) PCT Pub. No.: WO2022/063893
PCT Pub. Date: Mar. 31, 2022

(65) Prior Publication Data
US 2024/0012043 A1    Jan. 11, 2024

(30) Foreign Application Priority Data
Sep. 23, 2020    (GB) ...................................... 2015016

(51) Int. Cl.
*G01R 31/26* (2020.01)
(52) U.S. Cl.
CPC ............................... *G01R 31/2635* (2013.01)

(58) Field of Classification Search
CPC .. G01R 31/26; G01R 31/2635; G01R 31/308; H02S 50/10; Y02E 10/50
See application file for complete search history.

(56) References Cited

U.S. PATENT DOCUMENTS 7,129,100 B2    10/2006   Joyner et al.
7,135,382 B2    11/2006   Joyner et al.
(Continued)

FOREIGN PATENT DOCUMENTS

KR    20180046161    *  5/2018    ......... H01L 31/0216

OTHER PUBLICATIONS

English translation KR20180046161A (Year: 2018).*
(Continued)

*Primary Examiner* — Eman A Alkafawi
*Assistant Examiner* — Courtney G McDonnough
(74) *Attorney, Agent, or Firm* — Womble Bond Dickinson (US) LLP

(57) ABSTRACT

A method of testing one or more optoelectronic devices located on respective device coupons. The device coupon(s) are present on a wafer. The method comprises: testing the or each optoelectronic device using a corresponding testing element, the testing element(s) being located on the same wafer as the device coupon(s), by either: in a first testing protocol, operating the optoelectronic device so as to produce an optical output, and detecting the light incident on the testing element from the optoelectronic device under test, or in a second testing protocol, detecting, by the optoelectronic device under test, the light received from the testing element.

18 Claims, 5 Drawing Sheets

(56) References Cited

U.S. PATENT DOCUMENTS

| | | |
|---|---|---|
| 2007/0013400 A1 | 1/2007 | Lalonde et al. |
| 2018/0261658 A1* | 9/2018 | Cok ....................... G01R 31/28 |
| 2018/0313718 A1* | 11/2018 | Traverso .............. G02B 6/1228 |
| 2020/0027798 A1 | 1/2020 | Lin et al. |

OTHER PUBLICATIONS

International Search Report for PCT Application No. PCT/EP2021/076196 dated Jan. 12, 2022, 2 pages.

International Search Report and Written Opinion of the International Searching Authority, mailed on Jan. 12, 2022, corresponding to PCT/EP2021/076196, 8 pages.

U.K. Intellectual Property Office Combined Search and Examination Report, dated May 20, 2021, for Patent Application No. GB2015016.5, 7 pages.

* cited by examiner

METHOD OF TESTING, WAFER, AND TESTING STATION

CROSS-REFERENCE TO RELATED APPLICATIONS

The present application is a U.S. National Phase Patent Application of International Application No. PCT/EP2021/076196, filed on Sep. 23, 2021, which claims priority to and the benefit of Great Britain Patent Application No. 2015016.5, filed Sep. 23, 2020, the entire content of each of which is incorporated herein by reference.

FIELD OF THE INVENTION

The present invention relates to a method of testing, a wafer, and a testing station.

BACKGROUND

To date, optical wafer-level testing of active non-vertical photonic devices has been performed by means of a fibre optic cable incident at an angle close to parallel to the wafer plane. This fibre couples to the device under test, and allows for testing of the device (e.g. electro-optical conversion levels for lasers or optical-electrical conversion for modulators or photodiodes).

However this requires a highly complex setup, and is not compatible with large scale testing of photonic devices. This is notably a problem in the context of hybrid devices, i.e. devices comprising two materials systems, and where a device coupon (including the photonic device) is transferred from a source wafer to a host wafer e.g. via micro-transfer printing. Such bonding steps can be labour intensive and take a significant amount of time, and therefore it is desirous to know that the photonic devices within the device coupon meet the required specification before they are transferred to the host wafer.

Summary

Accordingly, in a first aspect, embodiments of the invention provide a method of testing one or more optoelectronic devices located on respective device coupons, the device coupon(s) being present on a wafer, the method comprising:
  testing the or each optoelectronic device using a corresponding testing element, the testing element(s) being located on the same wafer as the device coupon(s), by either:
  in a first testing protocol, operating the optoelectronic device so as to produce an optical output, and detecting the light incident on the testing element from the optoelectronic device under test, or
  in a second testing protocol, detecting, by the optoelectronic device under test, light received from the testing element.

As the testing element is on the same wafer as its corresponding optoelectronic device, the testing element is on the same plane as the corresponding optoelectronic device (i.e. the wafer plane). This ensures a good level of coupling therebetween without the need for complex alignment techniques. If the testing is performed before the device coupon(s) are bonded to a host wafer, then devices not operating to the required specification can be excluded from subsequent bonding processes. If the testing is performed after the device coupons have been bonded to the host wafer, then devices not operating to the required specification can be excluded from subsequent packaging processes.

By on the same plane, it may be meant that the wafer defines a planar surface and that both the optoelectronic device and testing element are on the same planar surface. By optoelectronic device, it may be meant any one of: a laser; a modulator (e.g. an electro-absorption modulator); a photodiode; or a semiconductor optical amplifier (SOA). The optoelectronic devices may be non-vertically emitting or receiving devices, by which it may be meant that the optoelectronic devices may comprise an input or output facet which is perpendicular to the wafer plane (that is, it receives or transmits an optical signal parallel to the wafer plane). By device coupon, it may be meant a structure suitable for a micro-transfer printing process e.g. one including a tether. The device coupon may be a multi-layered structure, including a sacrificial layer which is to be etched away before the device coupon is adhered to a stamp for micro-transfer printing. The device coupon may be a multi-layered structure and may include a tether suitable for adhesion to a stamp for micro-transfer printing. The wafer may be a source wafer, i.e. one on which the optoelectronic device and device coupon have been fabricated. Alternatively the wafer may be a host wafer, i.e. one on which the device coupon has been printed.

The method may have any one or, to the extent that they are compatible, any combination of the following optional features. These are applicable singly or in any combination with any aspect of the invention.

There may be a plurality of optoelectronic devices located on respective device coupons, and under the first testing protocol the testing element may be an optoelectronic device which is: adjacent the optoelectronic device of the plurality of optoelectronic devices which is under test, and placed under a reverse bias so as to operate as a photodiode.

Conveniently, this can remove the need for a dedicated testing element to be fabricated in addition to the optoelectronic devices.

The testing element may be a photodiode. That is, the testing element may comprise a P-I-N or P-N junction connected to respective contacts. There may be a plurality of optoelectronic devices located on respective device coupons, and the photodiode may be integrated in a device coupon adjacent to the optoelectronic device under test. Alternatively the photodiode may be formed in the wafer (i.e. directly on the wafer and not on a device coupon). The photodiode may be a ridge (e.g. a square or rectangular ridge, and may be a ridge waveguide), and the ridge may include a rough facet or an anti-reflective coating. The rough facet or anti-reflective coating may face the optoelectronic device under test. The photodiode may include an angled facet, which is configured to direct light towards the wafer. That is, the angled facet may partially face the upper surface of the wafer, for example projecting an angle of less than 90° from the surface of the wafer. This angled facet can reduce reflections back to the device under test.

The testing element(s) may be integrated with the corresponding device coupon. For example, if the optoelectronic device is a laser, a small section (relative to the overall device) is operable in a reverse bias so that when the adjacent laser coupon shines onto the testing element light is detected. Making the testing element a portion of the optoelectronic device helps increase the device density as it reduces the space needed for testing elements.

The testing element(s) may be a rectangular section of the corresponding optoelectronic device presenting a wide surface to collect light emitted by the device under test. The surface may be flat, or may be curved to match the incident beam. An anti-reflective coating may be added, and may be configured to favour absorption of the incident beam into the structure. The testing element may be reversed biased by means of a metal pad placed on its top surface. The metal may also cover the side opposite the input side, and so provide a mirror surface that reflects back the input light for a second trip through the junction. This can enhance the sensitivity of the testing element.

The testing element may be a large area photodiode, utilising the existing epitaxial structure of the optoelectronic device to form a junction, and with a side facing the element under test which may be shaped and processed to maximise absorption of the mitted light into the testing element. Other than the side facing the device under test, the testing element need have no specific geometry. In some examples, it is rectangular and as long and wide as possible given the overall coupon geometry, so as to absorb as much light as possible form the device under test.

The testing element may be a reflector, which couples the optoelectronic device under test to an optical fibre located above the wafer. In the first testing protocol, light from the optoelectronic device under test may be reflected into the optical fibre and detected. In the second testing protocol, light may be provided from the optical fibre and reflected via the testing element to the optoelectronic device under test. The optical fibre may be a lensed optical fibre.

Under the second testing protocol, the testing element may be a laser on an adjacent device coupon, which is operated to illuminate the optoelectronic device under test.

In a second aspect, embodiments of the invention provide a wafer, including one or more optoelectronic devices located on respective device coupons, the wafer further comprising a corresponding testing element for the or each optoelectronic device.

As the or each testing element is on the same wafer as the respective optoelectronic device, the testing element is on the same plane as its respective optoelectronic device. This ensures a good level of coupling without the need for complex alignment techniques. By on the same plane, it may be meant that the wafer defines a planar surface and that both the optoelectronic device and testing element are on the same planar surface. By optoelectronic device, it may be meant any one of: a laser; a modulator (e.g. an electro-absorption modulator); a photodiode; or a semiconductor optical amplifier (SOA). By device coupon, it may be meant a structure suitable for a micro-transfer printing process e.g. one including a tether.

The wafer may have any one or, to the extent that they are compatible, any combination of the following optional features. These are applicable singly or in any combination with any aspect of the invention.

The wafer may comprise a plurality of optoelectronic devices, and the testing element may be an optoelectronic device on a device coupon adjacent to the optoelectronic device under test, operable in reverse bias as a photodiode.

The testing element may be a photodiode. That is, the testing element may comprise a P-I-N or P-N junction connected to respective contacts. There may be a plurality of optoelectronic devices located on respective device coupons, and the photodiode may be integrated in a device coupon adjacent to the optoelectronic device under test. Alternatively the photodiode may be formed in the wafer (i.e. directly on the wafer). The photodiode may be a ridge (e.g. a square or rectangular ridge, and may be a ridge waveguide), and the ridge may include a rough facet or an anti-reflective coating. The rough facet or anti-reflective coating may face the optoelectronic device under test. The photodiode may include an angled facet, which is configured to direct light towards the wafer. That is, the angled facet may partially face the upper surface of the wafer, for example projecting an angle of less than 90° from the surface of the wafer.

The testing element may be a reflector, which is configured to couple the optoelectronic device under test to an optical fibre when said optical fibre is provided above the wafer.

In a third aspect, embodiments of the present invention provide a testing station for testing one or more optoelectronic devices mounted to respective device coupons, the testing station comprising:
  a receptacle for receiving a wafer according to the second aspect; and
  electrodes, connectable to the or each optoelectronic device and/or the or each testing element, and configured
    in a first testing protocol, to provide a photocurrent to an optoelectronic device under test, and monitor a photocurrent generated from light incident on the corresponding testing element; and/or
    in a second testing protocol, to provide light via the testing element to an optoelectronic device under test, and monitor the photocurrent generated by the optoelectronic device under test.

The invention includes the combination of the aspects and preferred features described except where such a combination is clearly impermissible or expressly avoided.

Further aspects of the present invention provide: a computer program comprising code which, when run on a computer, causes the computer to perform the method of the first aspect; a computer readable medium storing a computer program comprising code which, when run on a computer, causes the computer to perform the method of the first aspect; and a computer system programmed to perform the method of the first aspect.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Aspects and embodiments of the present invention will now be discussed with reference to the accompanying figures. Further aspects and embodiments will be apparent to those skilled in the art.

Figure 1:
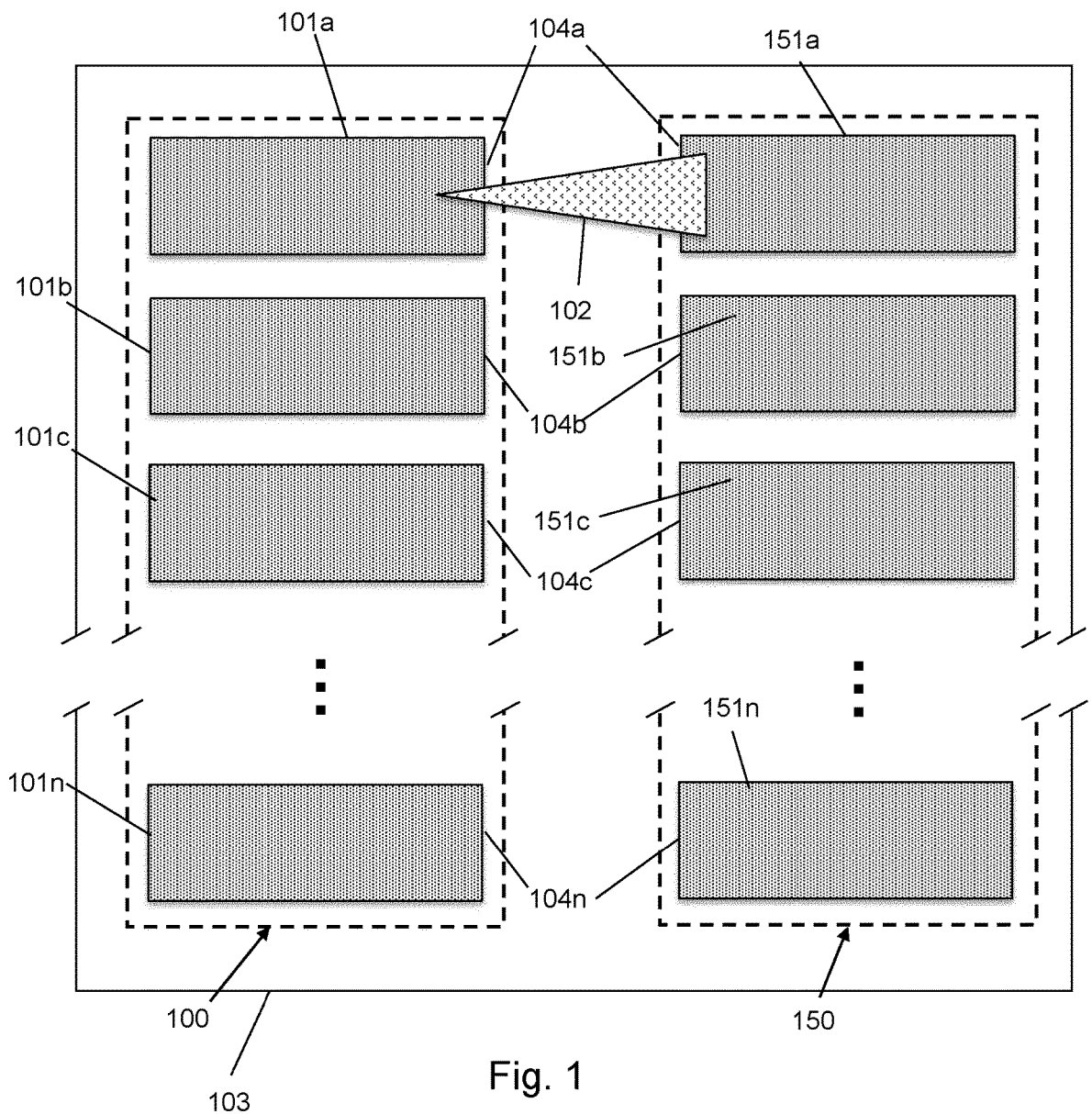
FIG. 1 is a top-down view of a wafer including a first and second array of device coupons.

FIG. 1 is a top-down view of a wafer 103 including a first 100 and second 150 array of device coupons, the device coupons including respective optoelectronic devices. The device coupons 101a-101n of the first array have respective facets 104a-104n which face corresponding facets 104a-104n of the device coupons 151a-151n of the second array.

Therefore, in a first testing protocol, the optoelectronic device on a first device coupon 101a is operated such that its optical output 102 is incident on the corresponding facet of the device coupon 151a in the adjacent array. By operating the optoelectronic device in the adjacent device coupon 151 as a photodiode (for example, by reverse biasing it if the optoelectronic device is a laser or EAM), the intensity of the light emitted from the device under test (in the first array, in this example) can be established. In this manner, the optoelectronic device in the device coupon next to that under test functions as the testing element, and the electrical to optical (EO) efficiency of the device under test can be ascertained.

In a second testing mode, where the optoelectronic device to be tested is a photodiode, it is illuminated by an optoelectronic device (e.g. laser or EAM with on-board light source) on an adjacent device coupon. In this manner, the optical to electrical (OE) efficiency of the device under test can be ascertained.

Advantageously, this means that both the device under test and the testing element are in the same plane (by virtue of being on the same wafer 103). Accordingly, better coupling between the device under test and the testing element can be achieved and, further, the complicated alignment of optical fibres can be avoided.

Figure 2:
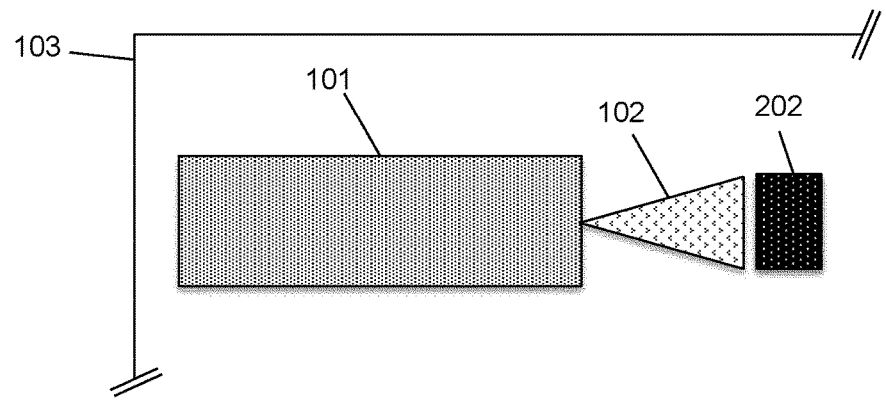
FIG. 2 is a top-down view of a device coupon and photodiode.

FIG. 2 is a top-down view of a device coupon 101 and photodiode 202, both present on a wafer 103. In this instance, in the first testing protocol, the optoelectronic device in the device coupon 101 is operated such that its optical output 102 is incident on the photodiode 202. In this example, the photodiode 202 is a square or rectangular ridge containing a P-I-N or P-N junction connected to respective electrodes. The photodiode may be formed from indium phosphide if the optoelectronic devices are being tested on the source wafer (i.e. before printing) or they may be formed from silicon or silicon germanium if the optoelectronic devices are being tested on the host wafer (i.e. after printing). In this manner, the EO efficiency of the optoelectronic device in the device coupon 101 can be ascertained. In contrast to the example in FIG. 1, the photodiode 202 will collect more of the light than a reverse biased optoelectronic device (and so the testing can be performed more accurately).

Figure 3:
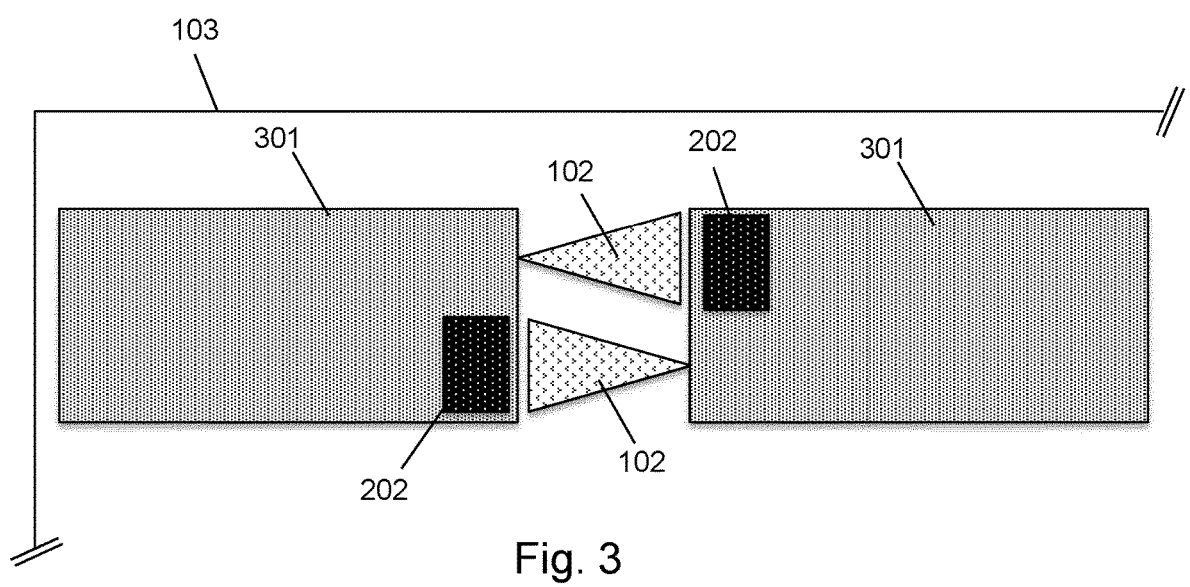
FIG. 3 is a top-down view of a pair of device coupons with respective photodiodes.

FIG. 3 is a top-down view of a pair of device coupons 301 with respective photodiodes 202. In contrast to the embodiment shown in FIG. 2, in the embodiment of FIG. 3 the photodiodes 202 are integrated in respective device coupons 301. Advantageously, this reduces the footprint of the testing elements on the wafer, and so allows for a greater number of device coupons to be situated on the wafer. Moreover it can allow simultaneous testing of both device coupons 301 which may be members of respective arrays (as discussed with reference to FIG. 1).

Figure 4:
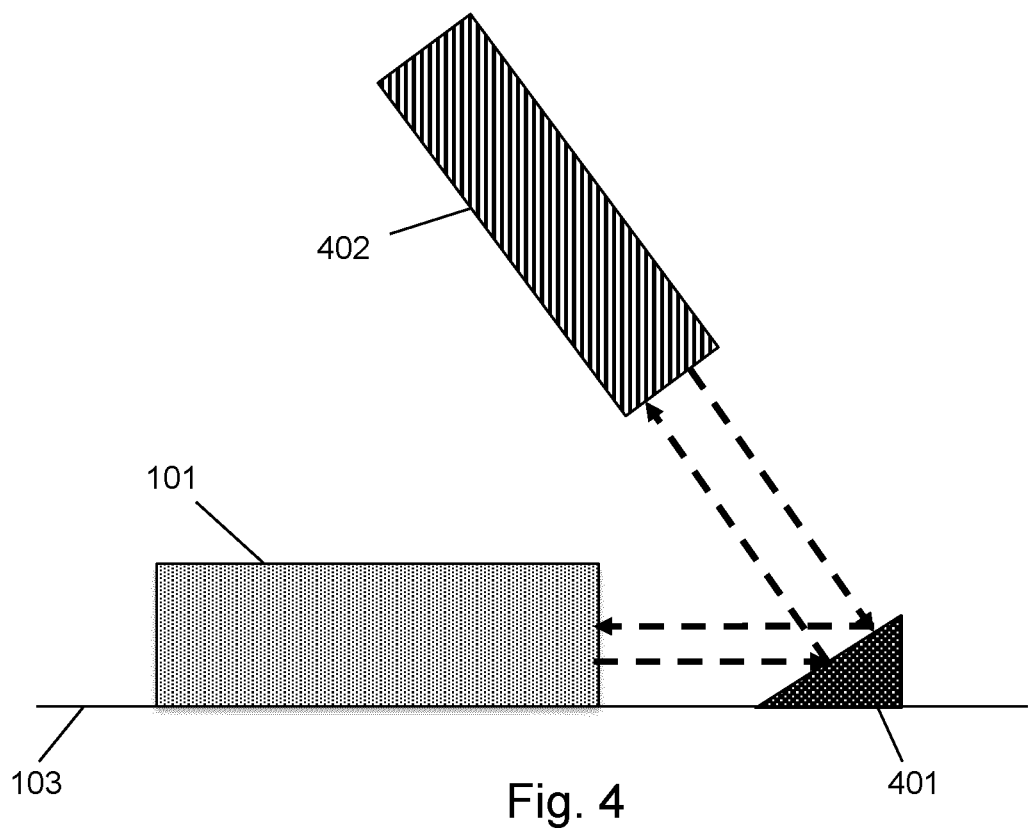
FIG. 4 is a side-on view of a device coupon and reflector.

FIG. 4 is a side-on view of a device coupon 101 and reflector 401 on a wafer 103. The reflector 401 is an angled mesa-like structure which is fabricated in front of the device coupon 101 to direct light at an upward angle to be collected by a lensed fibre 402. The etch of the mesa, to provide the angled facet, is achieved by exploiting the crystal orientation dependency of the III-V material forming the reflector with an anisotropic wet etch. The optoelectronic device in device coupon 101 may be any of: a laser; a photodiode; a modulator; and a SOA. Where the optoelectronic device is a source of light (e.g. a laser) light emitted from the device coupon 101 is reflected into the optical fibre 402 and detected according to the first testing protocol. Where the optoelectronic device operates to convert received light into photocurrent (e.g. a photodiode or modulator), light is provided from the lensed fibre and reflected onto the device coupon 101 for detection via the reflector 401.

Figure 5:
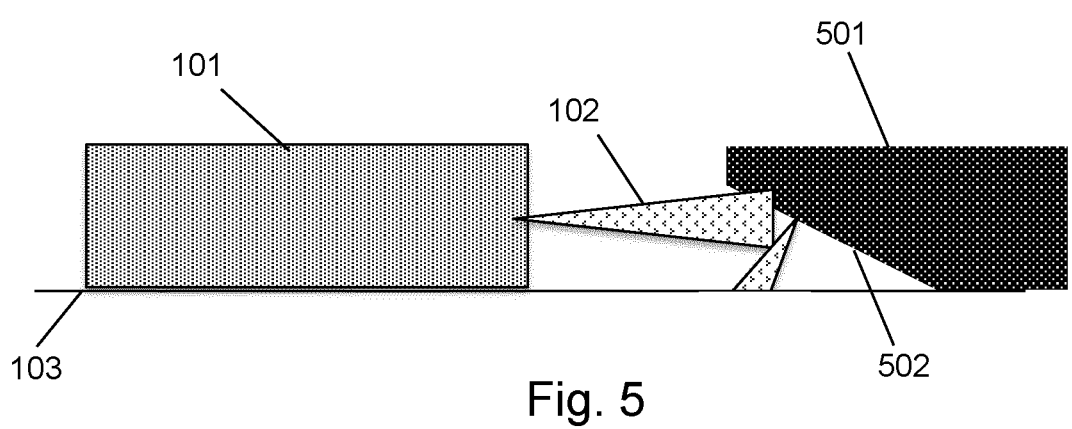
FIG. 5 is a side-on view of a device coupon and angled photodiode.

FIG. 5 is a side-on view of a device coupon 101 and angled photodiode 501 on a wafer 103. In contrast to the reflector 401 discussed previously, here the angled photodiode 501 directs light down towards the wafer 103 using angled facet 502. This avoids reflections back to the facet of the device coupon 101, and can increase the efficiency with which the photodiode 501 absorbs the optical signal originating from the optoelectronic device on the device coupon 101.

Figure 6:
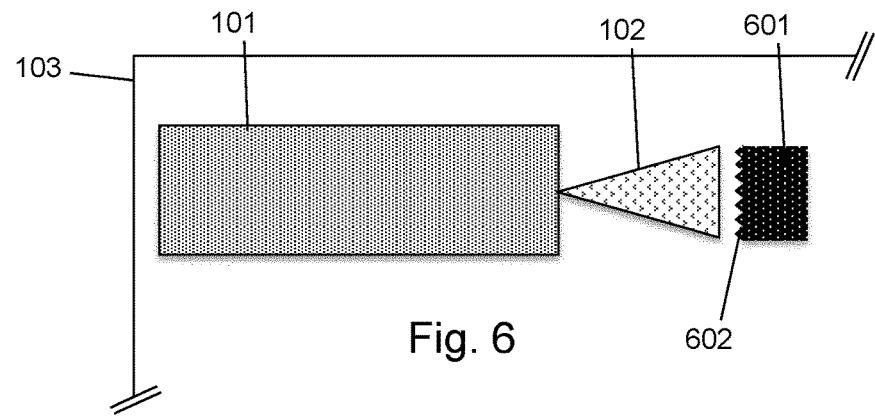
FIG. 6 is a top-down view of a device coupon and variant photodiode.
Figure 7:
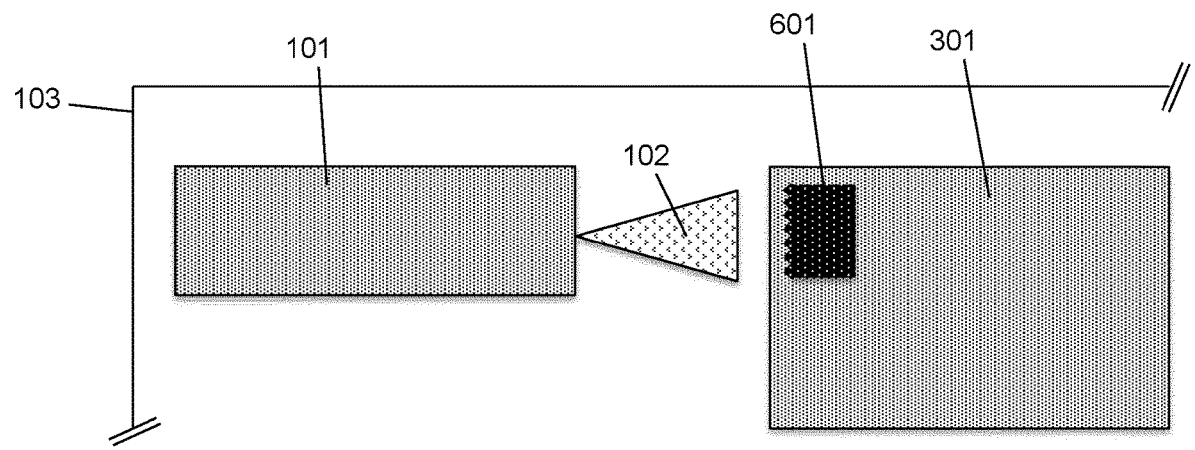
FIG. 7 is a top-down view of a pair of device coupons one of which includes a variant photodiode.

FIG. 6 is a top-down view of a device coupon 101 and variant photodiode 601. Where the example in FIG. 6 shares features with the examples shown previously, like features are indicated by like reference numerals. In contrast to the photodiodes shown previously, variant photodiode 601 includes a rough surface 602 facing the device coupon 101. This rough surface avoids reflecting light back to the coupon, and makes the photodiode behave optically more like a blackbody. The roughness of the surface may be measured as the standard deviation of the surface height relative to the plane defining the surface. The roughness of the rough surface may be equal to ¼ of the operation wavelength, as this can maximise performance. For example, if the operation wavelength were 1310 nm, the surface roughness as measured as the standard deviation of the surface height relative to the plane defining the surface may have a value of around 327 nm. The surface roughness may be measured through scanning electron-microscope imaging, or profilometry on a dedicated surface with a favourable orientation. Additionally, or alternatively, the photodiode 601 may comprise an antireflective coating on a facet thereof which faces the device coupon 101. FIG. 7 is a top-down view of a pair of device coupons 101 and 301, one of which includes the variant photodiode 601.

Figure 8:
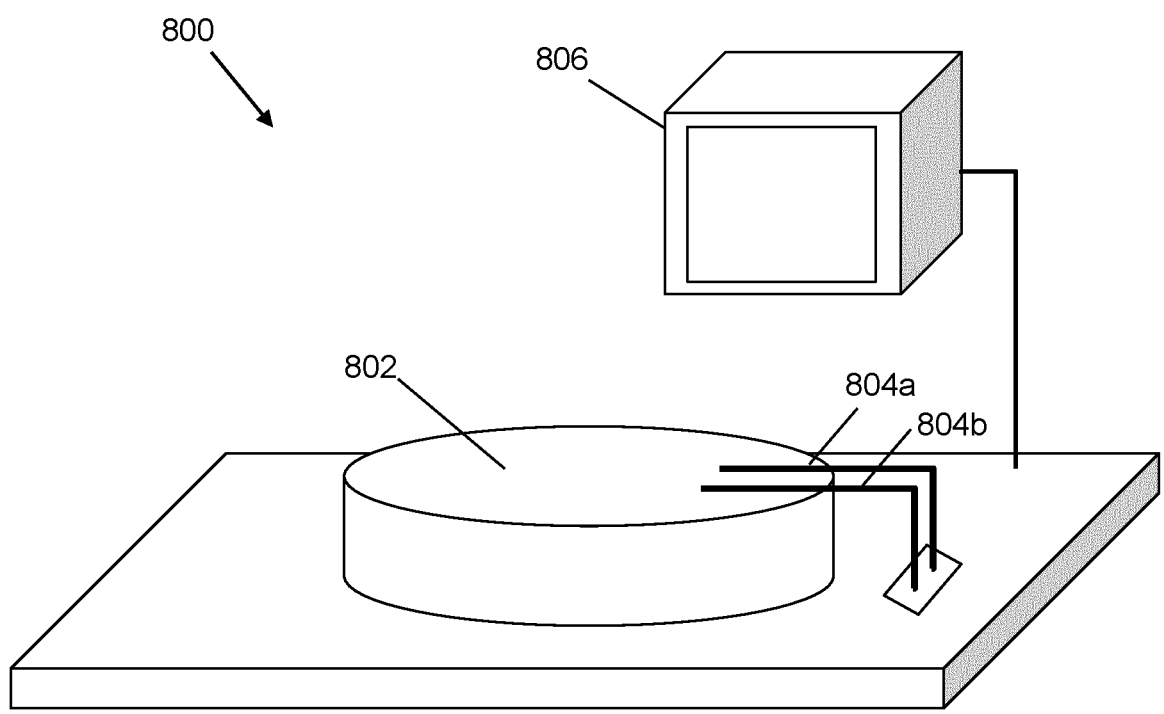
FIG. 8 is a testing station.

FIG. 8 is a testing station 800. The testing station includes a receptacle 802 for the wafer 103 discussed previously, and a plurality of electrodes 804a, 804b which are used to electrically connect to device coupons and testing elements on the wafer. The testing station 800 includes a processor 806 which may include a display. The processor is operated to perform testing of optoelectronic devices on the wafer according to the first or second testing protocol. The testing station may also include an array of lensed fibres (not shown) used to couple to respective reflectors on the wafer.

Whilst the wafers shown in the figures are rectangular, it will of course be appreciated that they may have any shape e.g. ovoid or circular.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

LIST OF FEATURES

100/150 Array of device coupons
101a-n Device coupons

102 Emitted light
103 Wafer
104a-n Facet
151a-n Device coupons
202 Photodiode
301 Variant device coupon
401 Reflector
402 Lensed optical fibre
501, 601 Variant photodiode
502 Angled facet
602 Rough facet
800 Testing station
802 Wafer receptacle
804a,b Electrodes
806 Processor including display

The invention claimed is:

1. A method of testing one or more optoelectronic devices located on one or more respective device coupons, the one or more device coupons being present on a wafer, the method comprising:
    testing a first optoelectronic device of the one or more optoelectronic devices using a testing element, the first optoelectronic device being located on a device coupon of the one or more device coupons, the testing element being located on the same wafer as the device coupon, by either:
    in a first testing protocol, operating the first optoelectronic device so as to produce an optical output, and detecting light incident on the testing element from the first optoelectronic device, or
    in a second testing protocol, detecting, by the first optoelectronic device, light received from the testing element,
    wherein under the second testing protocol, the testing element is a laser on an adjacent device coupon, which is operated to illuminate the first optoelectronic device.

2. The method of claim 1, wherein there is a plurality of optoelectronic devices located on respective device coupons, and wherein under the first testing protocol the testing element is a second optoelectronic devices which is:
    adjacent the first optoelectronic device of the plurality of optoelectronic devices, and
    placed under a reverse bias so as to operate as a photodiode.

3. The method of claim 2, wherein the testing element is a photodiode.

4. The method of claim 3, wherein the photodiode is incorporated in a device coupon adjacent to the first optoelectronic device.

5. The method of claim 4, wherein the photodiode is formed in the wafer.

6. The method of claim 4, wherein the photodiode includes a rough facet or an anti-reflective coating.

7. The method of claim 4, wherein the photodiode includes an angled facet, configured to direct light towards the wafer.

8. The method of claim 1, wherein the testing element is a reflector, which couples the first optoelectronic device to an optical fibre located above the wafer.

9. The method of claim 8, wherein, in the first testing protocol, light from the first optoelectronic device is reflected into the optical fibre and detected.

10. The method of claim 8, wherein, in the second testing protocol light is provided from the optical fibre and reflected via the testing element to the first optoelectronic device.

11. A wafer, comprising:
    one or more optoelectronic devices located on respective device coupons;
    a corresponding testing element of one or more test elements for the or each optoelectronic device; and
    a plurality of optoelectronic devices located on respective device coupons,
    wherein a first testing element of the one or more testing elements is a first optoelectronic device, of the plurality of optoelectronic devices, on a device coupon adjacent to a second optoelectronic device, of the plurality of optoelectronic devices, the second optoelectronic device being a device under test, operable in reverse bias as a photodiode.

12. The wafer of claim 11, wherein a testing element of the one or more test elements is a photodiode.

13. The wafer of claim 12, comprising a plurality of optoelectronic devices located on respective device coupons, wherein the photodiode is incorporated in a device coupon adjacent to an optoelectronic device of the one or more optoelectronic devices, the optoelectronic device being a device under test.

14. The wafer of claim 12, wherein the photodiode is formed in the wafer.

15. The wafer of claim 13, wherein the photodiode includes a rough facet or an anti-reflective coating.

16. The wafer of claim 13, wherein the photodiode includes an angled facet, configured to direct light towards the wafer.

17. The wafer of claim 11, wherein a testing element of the one or more testing elements is a reflector, which is configured to couple an optoelectronic device of the one or more optoelectronic devices to an optical fibre.

18. A testing station for testing one or more optoelectronic devices mounted to respective device coupons, the testing station comprising:
    a receptacle for receiving a wafer according to claim 12; and
    electrodes, connectable to the or each optoelectronic device or the or each testing element, and configured
        in a first testing protocol, to provide a photocurrent to an optoelectronic device under test, and monitor a photocurrent generated from light incident on the corresponding testing element; or
        in a second testing protocol, to provide light via the testing element to an optoelectronic device under test, and monitor the photocurrent generated by the optoelectronic device under test.

* * * * *